United States Patent
Park et al.

(10) Patent No.: US 10,818,742 B2
(45) Date of Patent: Oct. 27, 2020

(54) DISPLAY APPARATUS AND ELECTRONIC APPARATUS INCLUDING THE SAME

(71) Applicant: Samsung Display Co., Ltd., Yongin-si, Gyeonggi-do (KR)

(72) Inventors: Yongjun Park, Yongin-si (KR); Wooyong Sung, Yongin-si (KR); Sunghoon Yang, Yongin-si (KR); Seyoon Oh, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/443,976

(22) Filed: Jun. 18, 2019

(65) Prior Publication Data

US 2020/0052054 A1     Feb. 13, 2020

(30) Foreign Application Priority Data

Aug. 8, 2018  (KR) .................. 10-2018-0092693

(51) Int. Cl.
  *H01L 51/52*  (2006.01)
  *H01L 27/32*  (2006.01)
  *H04N 5/225*  (2006.01)

(52) U.S. Cl.
  CPC ...... *H01L 27/3262* (2013.01); *H01L 27/3225* (2013.01); *H01L 51/5237* (2013.01); *H04N 5/2257* (2013.01)

(58) Field of Classification Search
  CPC .............. H01L 27/323; H01L 27/3225; H01L 27/3262; H04N 5/2257
  See application file for complete search history.

(56) References Cited

U.S. PATENT DOCUMENTS

| | | | |
|---|---|---|---|
| 8,456,586 B2 | 6/2013 | Mathew et al. | |
| 9,123,276 B2 | 9/2015 | Park et al. | |
| 10,044,002 B2 | 8/2018 | Lee et al. | |
| 10,205,122 B2* | 2/2019 | Choi | H01L 27/3258 |
| 10,454,067 B2* | 10/2019 | Seo | H01L 51/5256 |
| 10,497,900 B2* | 12/2019 | Choi | H01L 51/0096 |

(Continued)

FOREIGN PATENT DOCUMENTS

| KR | 1020170036447 A | 4/2017 |
|---|---|---|
| KR | 1020170088457 A | 8/2017 |

(Continued)

*Primary Examiner* — Nicholas J Tobergte
(74) *Attorney, Agent, or Firm* — Cantor Colburn LLP

(57) ABSTRACT

A display apparatus includes an insulating layer on a substrate, the substrate including a main through hole, a first groove around and outside the main through hole, and a first test concave portion outside the main through hole, and the insulating layer including a main insulating through hole connected to the main through hole, a first insulating through ring around and outside the main insulating through hole and connected to the first groove, and a first insulating through hole outside the main insulating through hole and connected to the first test concave portion. Along a same width direction: at a same position along the substrate, a width of the first insulating through ring of the insulating layer is less than a width of the first groove of the substrate, and a width of the first insulating through hole is less than a width of the first test concave portion.

20 Claims, 6 Drawing Sheets

(56) References Cited

U.S. PATENT DOCUMENTS

| | | | |
|---|---|---|---|
| 2012/0069241 A1* | 3/2012 | Shiau | G06F 1/1605 |
| | | | 348/373 |
| 2017/0059771 A1* | 3/2017 | Yuki | G02B 6/0088 |
| 2017/0235398 A1 | 8/2017 | Choi et al. | |
| 2017/0256747 A1 | 9/2017 | Lee et al. | |
| 2017/0287992 A1 | 10/2017 | Kwak et al. | |
| 2017/0373129 A1 | 12/2017 | Kim et al. | |
| 2018/0069063 A1 | 3/2018 | Kim et al. | |
| 2019/0146251 A1* | 5/2019 | Shibano | G02F 1/1339 |
| | | | 349/43 |
| 2019/0267434 A1* | 8/2019 | Liu | G06F 1/1637 |

FOREIGN PATENT DOCUMENTS

| | | |
|---|---|---|
| KR | 1020170096565 A | 8/2017 |
| KR | 1020170104097 A | 9/2017 |
| KR | 1020170111827 A | 10/2017 |
| KR | 1020180002126 A | 1/2018 |
| KR | 1020180026599 A | 3/2018 |

* cited by examiner

DISPLAY APPARATUS AND ELECTRONIC APPARATUS INCLUDING THE SAME

This application claims priority to Korean Patent Application No. 10-2018-0092693, filed on Aug. 8, 2018, and all the benefits accruing therefrom under 35 U.S.C. § 119, the disclosure of which is incorporated herein in its entirety by reference.

BACKGROUND

1. Field

One or more embodiments relate to a display apparatus and an electronic apparatus including the same. More particularly, one or more embodiments relate to a display apparatus in which the occurrence of a defect may be reduced or effectively prevented during manufacture or use thereof and for which presence of a defect occurred during a manufacturing process may be quickly determined, and an electronic apparatus including the display apparatus.

2. Description of the Related Art

In general, an electronic apparatus, such as a mobile phone, includes a display apparatus to visually transmit information. Such a display apparatus occupies a substantial portion of a front surface of the electronic apparatus. For a widely used electronic apparatus, most of the front surface of the electronic apparatus corresponds to a display surface of the display apparatus.

SUMMARY

A defect may occur in a general display apparatus or electronic apparatus during manufacture or use thereof. As an example, when a display apparatus includes an organic light-emitting diode ("OLED"), the OLED may deteriorate quickly owing to an impurity such as moisture of oxygen incident to a material within the OLED, and thus the life of the display apparatus or electronic apparatus may be decreased.

One or more embodiments include a display apparatus in which the occurrence of a defect during manufacture or use thereof may be reduced or effectively prevented, and for which determination of whether a defect occurred during a manufacturing process may be quickly determined, and an electronic apparatus including the display apparatus.

Additional features will be set forth in part in the description which follows and, in part, will be apparent from the description, or may be learned by practice of the presented embodiments.

According to one or more embodiments, a display apparatus includes: a substrate including defined therein: a main through hole extended through a thickness of the substrate, a first groove extended around the main through hole to be disposed outside the main through hole, and a first test concave portion disposed outside the main through hole; and an insulating layer on the substrate, the insulating layer including defined therein: a main insulating through hole aligned with and connected to the main through hole of the substrate along the thickness thereof, a first insulating through ring extended around the main insulating through hole to be disposed outside the main insulating through hole, the first insulating through ring connected to the first groove of the substrate along the thickness thereof, and a first insulating through hole disposed outside the main insulating through hole, the first insulating through hole connected to the first test concave portion of the substrate along the thickness thereof. Along a same width direction: at a first same position along the substrate, a width of the first insulating through ring of the insulating layer is less than a width of the first groove of the substrate, and a width of the first insulating through hole is less than a width of the first test concave portion.

A center of the main through hole and a center of the insulating through hole may be aligned with each other, a center of the width of the first groove and a center of the width of the first insulating through ring may be aligned with each other, and a center of the width of the first test concave portion and a center of the width of the first insulating through hole may be aligned with each other.

The first test concave portion may be between the main through hole and the first groove.

The width of the first insulating through ring and the width of the first insulating through hole may be the same.

The display apparatus may further include a first remaining layer as a portion of an oxygen-permeable or a moisture-permeable material layer on the substrate, the first remaining layer disposed in the first groove. The display apparatus may further include a main layer as a portion of the same oxygen-permeable or the same moisture-permeable material layer as the first remaining layer, the main layer disposing the insulating layer between the substrate and the main layer and being disconnected from the first remaining layer.

The substrate may further include a second groove extended around the main through hole to be disposed outside the main through hole and spaced apart from the first groove, and the insulating layer may further include a second insulating through ring extended around the insulating through hole to be disposed outside the insulating through hole, spaced apart from the first insulating through ring, and connected to the second groove along the thickness of the substrate. At a second same position along the substrate different from the first same position, a width of the second insulating through ring of the insulating layer is less than a width of the second groove of the substrate.

The display apparatus may further include: a first remaining layer as a portion of an oxygen-permeable or a moisture-permeable material layer on the substrate, the first remaining layer disposed in the first groove; and a second remaining layer as a portion of the same oxygen-permeable or the same moisture-permeable material layer as the first remaining layer, the second remaining layer disposed in the second groove and being disconnected from the first remaining layer. The display apparatus may further include a main layer as a portion of the same oxygen-permeable or the same moisture-permeable material layer as the first and second remaining layers, the main layer disposing the insulating layer between the substrate and the main layer and being disconnected from each of the first and second remaining layers.

The substrate may further include a second test concave portion disposed outside the main through hole and spaced apart from the first test concave portion, and the insulating layer may further include a second insulating through hole disposed outside the main insulating through hole, spaced apart from the first insulating through hole, and connected to the second test concave portion. At a third same position along the substrate different from the first same position, a width of the second insulating through hole of the insulating layer is less than a width of the second test concave portion of the substrate.

The first test concave portion and the second test concave portion may each be disposed between the main through hole and the first groove.

The substrate may further include a display area and the main through hole may be disposed inside the display area. The display apparatus may further include: a light-emitting element which is disposed on a portion of the insulating layer corresponding the display area, the light-emitting element including a pixel electrode, an opposite electrode, and an intermediate layer between the pixel electrode and the opposite electrode and together with the pixel and opposite electrodes generate light, the intermediate layer being a portion of an intermediate material layer; and a first remaining layer as a portion of the same intermediate material layer as the intermediate layer of the light-emitting element. The first remaining layer may be disposed in the first groove to be disconnected from the intermediate layer of the light-emitting element.

The substrate may further include a first polymer layer, a second polymer layer which is closer to the insulating layer than the first polymer layer, and a barrier layer between the first polymer layer and the second polymer layer. The main through hole may penetrate a thickness of each of the first polymer layer, the barrier layer, and the second polymer layer. From the upper surface of the substrate and along the thickness of the substrate, a depth of the first groove and a depth of the first test concave portion are each less than a thickness of the second polymer layer.

The insulating layer may include an inorganic material.

According to one or more embodiments, an electronic apparatus includes: the display apparatus above; and an image pickup device or speaker inserted into the main through hole.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
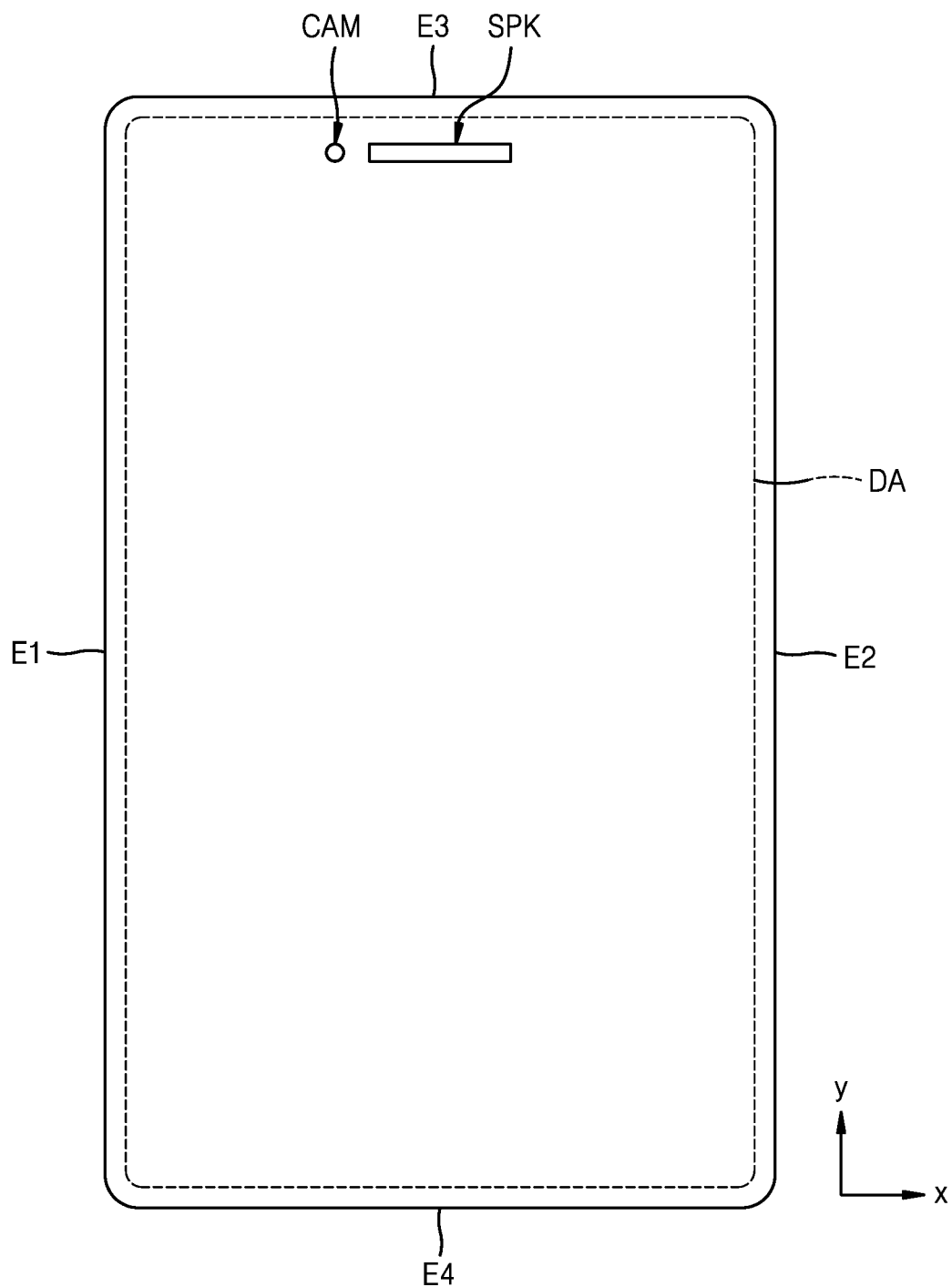
FIG. 1 is a top plan view of an embodiment of an electronic apparatus, according to the invention.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain features of the present description.

In drawings, like reference numerals refer to like elements throughout and overlapping descriptions shall not be repeated.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a component or layer is referred to as being related to another element such as being "on" another component or layer, the component or layer can be directly on another component or layer or intervening component or layers. In contrast, when an element is referred to as being related to another element such as being "directly on" another element, there are no intervening elements present.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, for convenience of description, sizes of components may be exaggerated for clarity. For example, since sizes and thicknesses of components in drawings are arbitrarily shown for convenience of description, the sizes and thicknesses are not limited thereto.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a top plan view of an embodiment of an electronic apparatus, according to the invention. More particularly, FIG. 1 is a top plan view of an embodiment of a front surface of an electronic apparatus, according to the invention. As shown in FIG. 1, most of the front surface of the electronic apparatus is occupied or defined by a display apparatus including a display area DA. That is, most of the front surface of the electronic apparatus is occupied or defined by the display area DA of the display apparatus. The display apparatus is controlled or driven by various electrical signals to generate and/or display an image such as by using light.

In an embodiment, for example, a first edge E1, a second edge E2, a third edge E3 and/or a fourth edge E4 of the electronic apparatus may be adjacent to but spaced apart from corresponding edges of the display area DA. The electronic apparatus, the display apparatus and components thereof may be disposed in a plane defined by an x-axis direction and a y-axis direction which cross or intersect each other (e.g., an x-y plane). Referring to FIG. 1, for example, edges E1 and E2 lengthwise extend along the y-axis direction, while edges E3 and E4 lengthwise extend along the x-axis direction. A thickness of the electronic apparatus, the display apparatus and components thereof may be defined in a direction which crosses or intersects each of the x-axis direction and the y-axis direction (e.g., a z-axis direction). Referring again to FIG. 1, for example, a thickness of the electronic apparatus extends into the page view along the z-axis direction, to cross each of the x-axis direction and the y-axis direction.

The electronic apparatus, such as a mobile phone, may include other input and output components, such as a camera CAM, a speaker SPK, etc. with which visual, audio or other information is input to or output from the electronic apparatus, in addition to the display apparatus, as shown in FIG. 1. Some of the components may need to be exposed to outside the electronic apparatus. Such components may be exposed at the front surface of the electronic apparatus. When a planar area of the display area DA occupying the front surface of the electronic apparatus is increased, some of the components, such as the camera CAM and the speaker SPK, are positioned in the display area DA which occupies most of the front surface of the electronic apparatus, as shown in FIG. 1. Here, a display device of the display apparatus is not arranged in regions where such components of the electronic apparatus are positioned. However, when the display area DA of the display apparatus is defined as substantially an entire inner region relative to an outermost edge where a display device is positioned, it may be understood that some of the components of the electronic apparatus are positioned in the display area DA as shown in FIG. 1.

Figure 2:
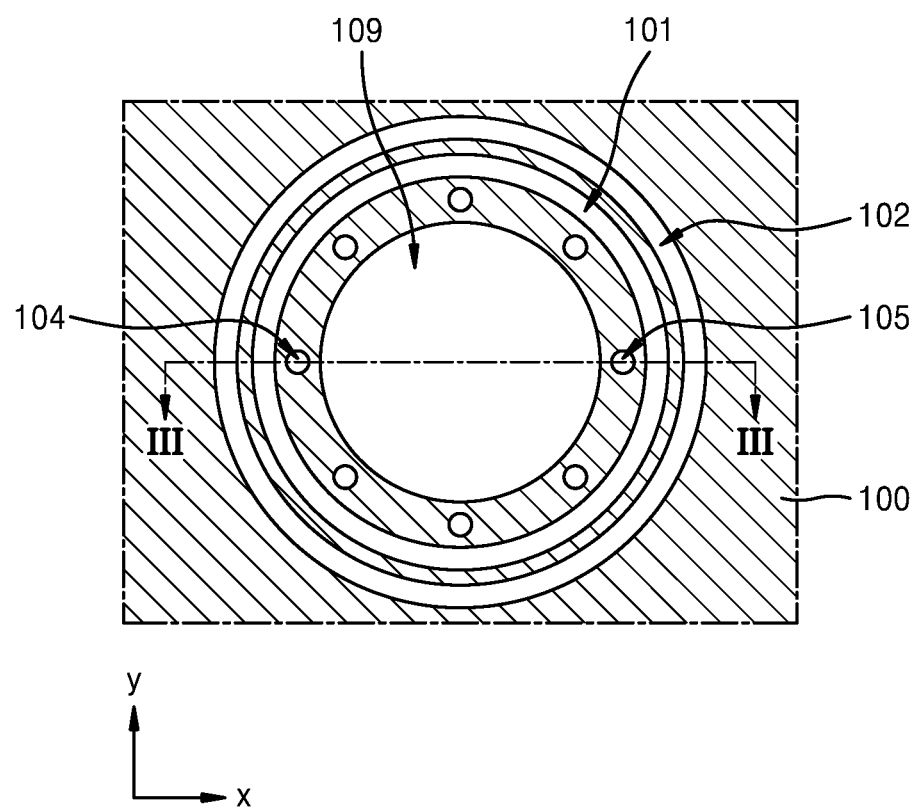
FIG. 2 is an enlarged top plan view of a portion of an embodiment of a substrate of a display apparatus included in the electronic apparatus of FIG. 1.

FIG. 2 is an enlarged top plan view of a portion of an embodiment of a substrate 100 of a display apparatus included in the electronic apparatus of FIG. 1. In an embodiment, for example, in FIG. 2, a region of the electronic apparatus of FIG. 1 where a component which is exposed to outside the electronic apparatus (such as the camera CAM) is positioned may be understood as a portion of the substrate 100. The substrate 100 may hereinafter refer to a base substrate of the display apparatus. Various layers (insulating, conductive, functional, etc.) of the display apparatus may be disposed on the base substrate thereof. For convenience of description, the substrate 100 shown in FIG. 2 is considered as a base substrate (see 100 in FIG. 3) on which various layers of the display apparatus are disposed.

The substrate 100 includes a main through hole 109, a first groove 101, a second groove 102, a first test concave portion 104 and a second test concave portion 105. The main through hole 109, the first groove 101 and the second groove 102 may be understood as being positioned in the display area DA (see FIG. 1) as described above. When the first test concave portion 104 and the second test concave portion 105 are positioned between the main through hole 109 and the first groove 101, the first and second test concave portions 104 and 105 may also be positioned in the display area DA.

In an embodiment, the first and second test concave portions 104 and 105 may be provided outside the display area DA. Since positions of a first insulating through hole 124 (see FIG. 3) and a second insulating through hole 125 (see FIG. 3) correspond to the positions of the first test concave portion 104 and the second test concave portion 105, respectively, when the first and second test concave portions 104 and 105 are positioned outside the display area DA, the first and second insulating through holes 124 and 125 are also correspondingly positioned outside the display area DA.

The main through hole 109 is an opening penetrating the substrate 100. The main through hole 109 may penetrate through an entire thickness of the substrate 100 as a collective display substrate (or through an entire thickness of the substrate 100 as a base substrate and various layers thereon). An inside of the main through hole 109, such as an inner wall or sidewall of layers forming the main through hole 109, may be exposed outside of the display apparatus (or an electronic apparatus including the display apparatus).

The first and second grooves 101 and 102 may be understood as not penetrating the substrate 100 but having a structure in which a portion of a top surface (disposed furthest in +z-axis direction) of the substrate 100 is removed to a certain depth, such that the grooves are open in the +z-axis direction. In a top plan view, the first groove 101 is provided around the main through hole 109 and disposed outside the main through hole 109 as shown in FIG. 2. Similarly, the second groove 102 is provided around the main through hole 109 and disposed outside the main through hole 109 while being spaced apart from the first groove 101. In FIG. 2, the second groove 102 is positioned outside the first groove 101, to surround the first groove 101. The first and second grooves 101 and 102 may be concentric, without being limited thereto.

The first and second test concave portions 104 and 105 may also be understood as not penetrating the substrate 100 but having a structure in which a portion of the top surface (disposed furthest in +z-axis direction) of the substrate 100 is removed to a certain depth, such that the test concave portions are open in the +z-axis direction. Each of the first and second test concave portions 104 and 105 may approximately have a circular shape in the top plan view which may be taken perpendicular to a plane in which the substrate 100 is disposed. The first and second test concave portions 104 and 105 are provided outside the main through hole 109, and as shown in FIG. 2, may be positioned between the first groove 101 and the main through hole 109.

The positions of the first and second test concave portions 104 and 105 may be symmetrical based on the main through hole 109 as shown in FIG. 2. Here, in addition to the first and second test concave portions 104 and 105, similar or same test concave portions may be positioned around the main through hole 109 as shown in FIG. 2.

The substrate 100 may include various materials. In an embodiment, for example, when the substrate 100 include a flexible or bendable characteristic, the substrate 100 may include polymer resin, for example, polyether sulfone ("PES"), polyacrylate, polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC"), or cellulose acetate propionate ("CAP"). However, the substrate 100 may be variously modified, for example, may have a multilayer structure including two layers of polymer resin and a barrier layer of an inorganic material (silicon oxide, silicon nitride, or silicon oxynitride) arranged between the two layers.

Figure 3:
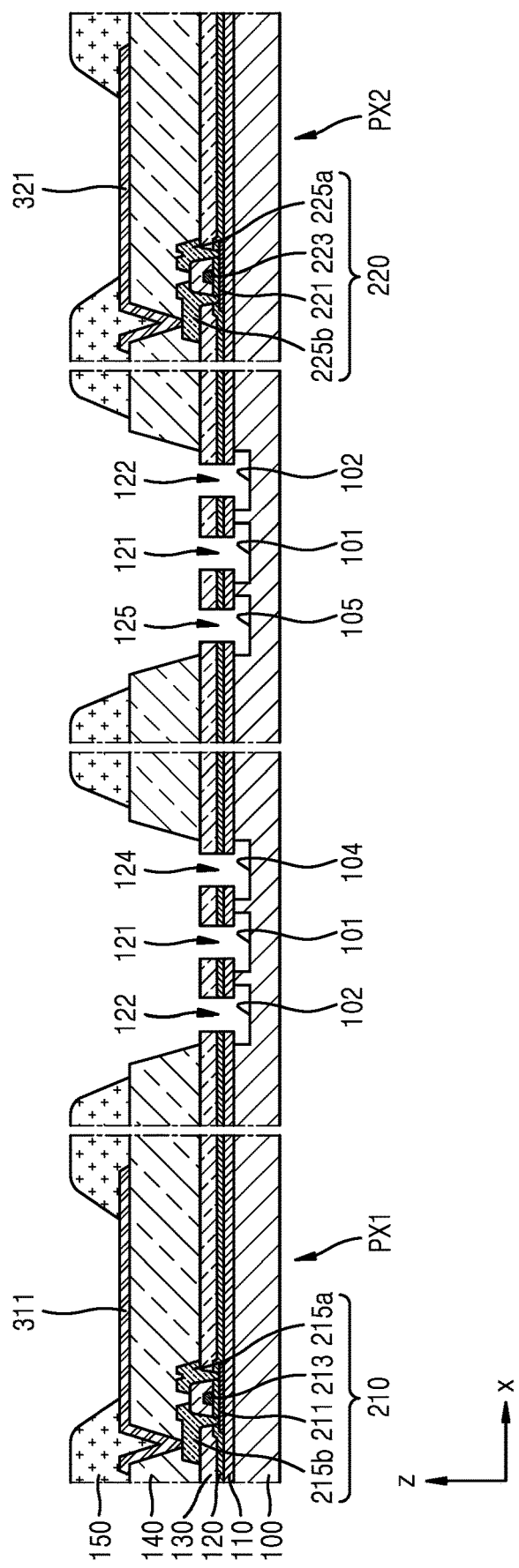
FIGS. 3 through 5 are cross-sectional views for describing an embodiment of a process of manufacturing the display apparatus included in the electronic apparatus of FIG. 1.
Figure 4:
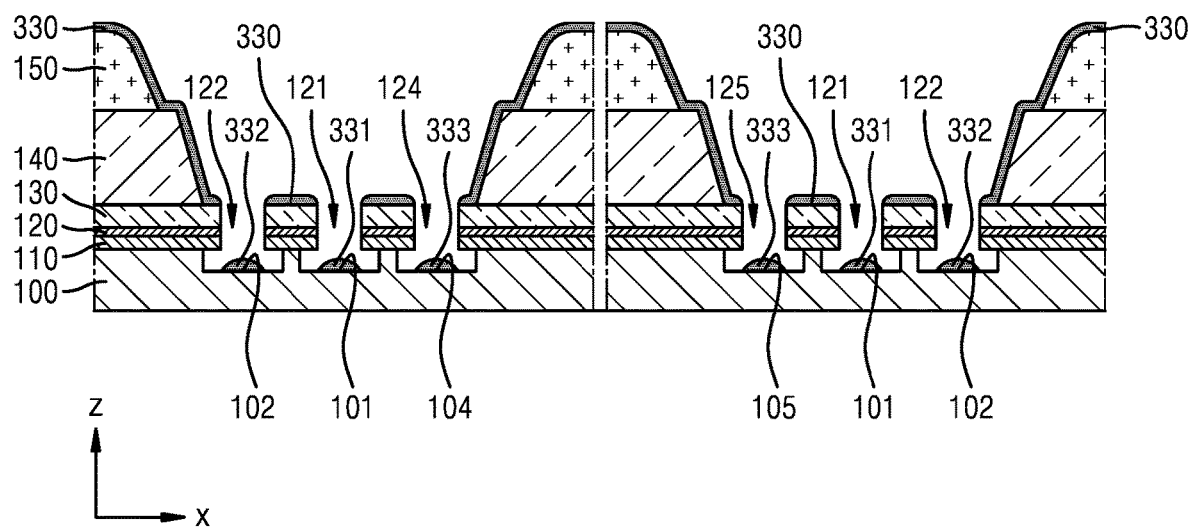
Figure 5:
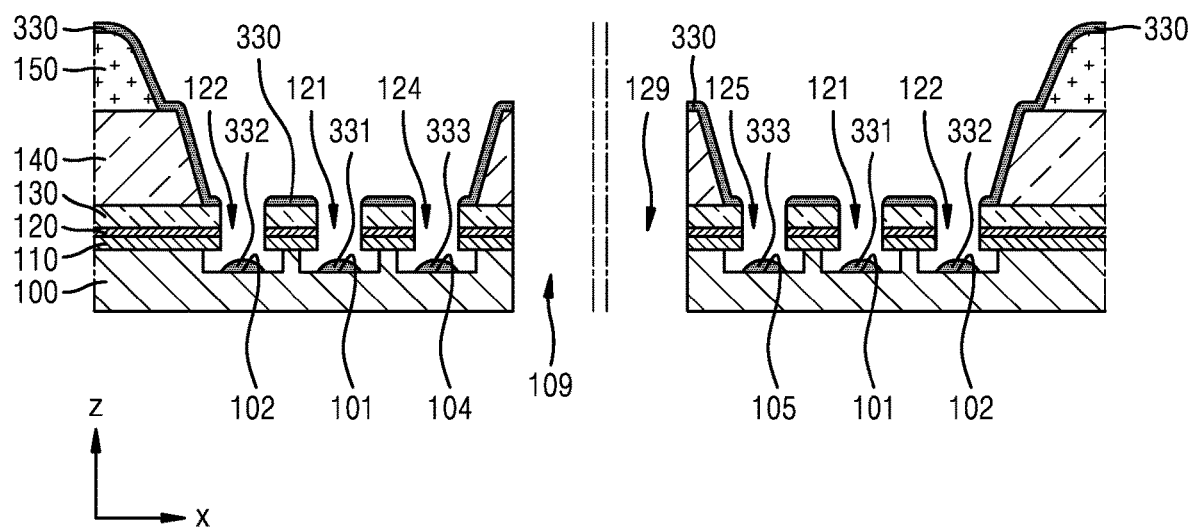

FIGS. 3 through 5 are cross-sectional views for describing an embodiment of a process of manufacturing the display apparatus included in the electronic apparatus of FIG. 1. FIGS. 3 through 5 are cross-sectional views taken along line III-III of FIG. 2, but components and layers other than the substrate 100 are also shown. FIG. 3 is a cross-sectional view during the process of manufacturing the display apparatus, and may be a shape of the display apparatus before the main through hole 109 (see FIG. 2) is provided in the substrate 100. Also, only a cross-section is shown in FIG. 3, and components behind the cross-section are omitted for convenience. While a horizontal direction in FIG. 3 is shown as the x-axis direction, it is understood that the horizontal direction may also represent the y-axis direction in embodiments of the invention.

A preliminary substrate 100 without the main through hole 109, the first groove 101, the second groove 102, the first test concave portion 104, and the second test concave portion 105 is prepared. A buffer layer 110 including an inorganic material, such as silicon oxide, silicon nitride, and/or silicon oxynitride, is provided on the preliminary substrate 100. The buffer layer 110 that is an insulating layer including the inorganic material may be provided via chemical vapor deposition ("CVD") or atomic layer deposition ("ALD"). The same is applied to an insulating layer including an inorganic material described later.

The buffer layer 110 may increase flatness of a top surface of the preliminary substrate 100, or effectively prevent or reduce penetration of impurities from the substrate 100 to a first semiconductor layer 211 of a first thin-film transistor ("TFT") 210 or a second semiconductor layer 221 of a second TFT 220 described below. The buffer layer 110 may have a single layer structure or a multilayer structure.

The first and second semiconductor layers 211 and 221 are provided at certain positions of the buffer layer 110. The first and second semiconductor layers 211 and 221 may be formed from a semiconductor material. The first and second semiconductor layers 211 and 221 may be provided by arranging a semiconductor material layer on the buffer layer 110 and patterning the semiconductor material layer. Alternatively, an amorphous silicon material layer may be provided and then crystallized.

A gate insulating layer 120 covering the first and second semiconductor layers 211 and 221 is provided by using an inorganic material, such as silicon oxide, silicon nitride and/or silicon oxynitride.

A first gate electrode 213 and a second gate electrode 223 are provided on the gate insulating layer 120. In an embodiment, for example, the first and second gate electrodes 213 and 223 corresponding to the first and second semiconductor layers 211 and 221 may be provided by arranging a conductive material layer by using molybdenum or aluminum, and then patterning the conductive material layer. That is, the first and second gate electrodes 213 and 223 may be formed from a same single material layer. The first and second gate electrode 213 and 223 may each have a single layer structure or a multilayer structure. In an embodiment, for example, the first and second gate electrodes 213 and 223 may each have a triple layer structure including a molybdenum layer, an aluminum layer and a molybdenum layer.

An interlayer insulating layer 130 covering the first and second gate electrodes 213 and 223 may be provided by using an inorganic material, such as silicon oxide, silicon nitride and/or silicon oxynitride. Contact holes exposing portions of the first and second semiconductor layers 211 and 221 are provided or defined in the interlayer insulating layer 130.

A first source electrode 215a and a first drain electrode 215b connected to the first semiconductor layer 211 at the contact holes, and a second source electrode 225a and a second drain electrode 225b connected to the second semiconductor layer 221 at the contact holes are provided. In an embodiment, for example, after arranging the contact holes, a conductive material layer may be provided on the interlayer insulating layer 130 and then patterned to provide the first source electrode 215a, the first drain electrode 215b, the second source electrode 225a, and the second drain electrode 225b. That is, the first source electrode 215a, the first drain electrode 215b, the second source electrode 225a, and the second drain electrode 225b may be formed from a same material layer.

The first source electrode 215a, the first drain electrode 215b, the second source electrode 225a, and the second drain electrode 225b may include titanium or aluminum, and may have a multilayer structure. In an embodiment, for example, the first source electrode 215a, the first drain electrode 215b, the second source electrode 225a, and the second drain electrode 225b may each have a triple layer structure including a titanium layer, an aluminum layer and a titanium layer. However, an embodiment is not limited thereto.

A planarization layer 140 covering the first source electrode 215a, the first drain electrode 215b, the second source electrode 225a and the second drain electrode 225b is provided. The planarization layer 140 covers the first and second TFTs 210 and 220, and may have a substantially flat top surface. Alternatively, a protection layer (not shown) including an inorganic material, such as silicon oxide, silicon nitride and/or silicon oxynitride, may be additionally arranged respectively between the first and second TFTs 210 and 220, and the planarization layer 140, and cover the first and second TFTs 210 and 220. The planarization layer 140 may include an organic material, such as acryl, benzocyclobutene ("BCB"), or hexamethyldisiloxane ("HMDSO"). In FIG. 3, the planarization layer 140 is a single layer, but may alternatively be a multilayer.

In the planarization layer 140, a via hole exposing at least a portion of one of the first source electrode 215a and the first drain electrode 215b, and a via hole exposing at least a portion of one of the second source electrode 225a and the second drain electrode 225 are provided. A conductive material layer is provided on the planarization layer 140 and patterned to provide a first pixel electrode 311 electrically connected to the first TFT 210 and a second pixel electrode 321 electrically connected to the second TFT 220. The first and second pixel electrodes 311 and 321 may each include, for example, indium tin oxide ("ITO"), indium zinc oxide ("IZO") or indium oxide ($In_2O_3$). Alternatively, the first and second pixel electrodes 311 and 321 may include a different material, for example, a conductive material or a metal, such as aluminum or copper.

On the first and second pixel electrodes 311 and 321, an insulating material layer is provided to cover the first and second pixel electrodes 311 and 321 and then patterned to provide a pixel-defining layer 150. The pixel-defining layer 150 defines a pixel of the display apparatus by defining an opening corresponding to each sub-pixel within a pixel, e.g., an opening exposing at least a center portion of the first pixel electrode 311 and at least a center portion of the second pixel electrode 321. Also, referring to FIG. 3, the pixel-defining layer 150 increases a respective cross-sectional distance between edges of each of the first and second pixel electrodes 311 and 321, and an opposite electrode (not shown), to be provided thereon, thereby reducing or effectively preventing an electrical arc from being generated at the edges of the first and second pixel electrodes 311 and 321. The pixel-defining layer 150 may be provided of an organic material, such as polyimide or HMDSO.

The substrate 100 along with the various layers of the buffer layer 110, the gate insulating layer 120, the interlayer insulating layer 130, the planarization layer 140 and the pixel-defining layer 150 thereon are patterned to provide the first groove 101, the second groove 102, the first test concave portion 104 and the second test concave portion 105 of the substrate 100 as described above with reference to FIG. 2. When the buffer layer 110, the gate insulating layer 120 and the interlayer insulating layer 130 are collectively referred to as a first insulating layer, the first groove 101, the second groove 102, the first test concave portion 104 and the second test concave portion 105 of the substrate 100 are provided by the patterning, and at the same time, a first insulating through ring 121, a second insulating through ring 122, the first insulating through hole 124, and the second insulating through hole 125 are provided or defined in the collective first insulating layer. In other words, shapes of the first insulating through ring 121, the second insulating through ring 122, the first insulating through hole 124, and the second insulating through hole 125 of the first insulating layer may be similar to and/or correspond to shapes of the first groove 101, the second groove 102, the first test concave portion 104, and the second test concave portion 105 of the substrate 100 of FIG. 2 in the top plan view of the substrate 100.

When the planarization layer 140 and the pixel-defining layer 150 are collectively referred to as a second insulating layer, an additional through ring is provided in the second insulating layer. As shown in FIG. 3, a same one additional through ring of the second insulating layer (not labeled) may correspond to the first and second insulating through rings 121 and 122 of the collective first insulating layer. In some cases, as shown in FIG. 3, a same one additional through ring of the second insulating layer may have a shape penetrating up to top portions of the first and second insulating through holes 124 and 125 of the first insulating layer. This same one additional through ring may also correspond to the first and second insulating through rings 121 and 122 of the collective first insulating layer.

Alternatively, when a distance along the x-axis direction between the first and second insulating through rings 121 and 122 of the first insulating layer is sufficiently large, the second insulating layer may have a first additional through ring corresponding to the first insulating through ring 121 and a second additional through ring corresponding to the second insulating through ring 122 and spaced apart from the first additional through ring, unlike the common same one additional through ring of the second insulating layer shown in FIG. 3. In this case, unlike FIG. 3, a portion of the planarization layer 140 and/or pixel-defining layer 150 remain on the interlayer insulating layer 130 in an area between the first and second insulating through rings 121 and 122 which defines the distance described above. The same is applied to embodiments and modifications thereof described hereinbelow.

As such, the first groove 101, the second groove 102, the first test concave portion 104 and the second test concave portion 105 of the substrate 100 formed from the preliminary substrate described above, and the first insulating through ring 121, the second insulating through ring 122, the first insulating through hole 124 and the second insulating through hole 125 of the first insulating layer are simultaneously provided. According to circumstances, the additional through ring of the second insulating layer may also be provided simultaneously with the grooves, portions and rings described above, or the first and second additional through rings of the second insulating layer may also be provided simultaneously with the grooves, portions and rings described above. For the patterning of the preliminary substrate 100 and the layers thereon described above, a wet etching method may be used. The same is applied to embodiments and modifications thereof described hereinbelow.

The collective first insulating layer includes an inorganic material whereas the preliminary substrate 100 (and final substrate formed therefrom) includes polymer resin as described above. Thus an etch rate of the substrate 100 is higher than an etch rate of the collective first insulating layer. Accordingly, at a same position along the substrate 100, the first insulating through ring 121 is connected to the first groove 101 while having a dimension (e.g., width) smaller than a dimension (e.g., a width) of the first groove 101, along the x-axis direction, the second insulating through ring 122 is connected to the second groove 102 while having the width smaller than the width of the second groove 102 along the x-axis direction, the first insulating through hole 124 is connected to the first test concave portion 104 while having a dimension (e.g., width) smaller than a dimension (e.g., a diameter) of the first test concave portion 104 along an x-y plane, and the second insulating through hole 125 is connected to the second test concave portion 105 while having a dimension (e.g., a width) smaller than a dimension (e.g., a diameter) of the second test concave portion 105 along the x-y plane. In other words, as shown in FIG. 3, at positions along the substrate 100, the holes and rings of the collective first insulating layer each have a shape respectively centered relative to of the first groove 101, the second groove 102, the first test concave portion 104 and the second test concave portion 105 of the substrate 100 to which the holes and rings are connected. As the holes and rings of the collective first insulating layer are connected to the various grooves and concave portions of the substrate 100 at various positions along the substrate 100, the corresponding connected features form a single opening along the z-axis direction at such various positions.

A shown in FIG. 3, at respective positions along the substrate 100, a center axis of the first groove 101 in the x-y plane and a center axis of the first insulating through ring 121 in the x-y plane match (e.g., are aligned with) each other, the center of the first test concave portion 104 in the x-y plane and the center of the first insulating through hole 124 on the x-y plane match each other, and the center of the second test concave portion 105 in the x-y plane and the center of the second insulating through hole 125 in the x-y plane match each other.

An intermediate layer including an emission layer ("EML") is provided on the first and second pixel electrodes 311 and 321. The intermediate layer may be used within a light-emitting member to generate and/or emit light for displaying an image. When the intermediate layer includes a relatively low-molecular weight material, the intermediate layer may further include a hole injection layer ("HIL"), a hole transport layer ("HTL"), an electron transport layer ("ETL") and an electron injection layer ("EIL"), and may be provided via a vapor deposition method. When the intermediate layer includes a relatively high-molecular weight material, the intermediate layer may further include an HTL, and may be provided via a screen print or inject print method, or a laser induced thermal imaging ("LITI") method. However, the intermediate layer is not limited thereto, and may have any one of various structures.

Among layers included in the intermediate layer, the EML may be patterned into islands (e.g., discrete shapes in the top plan view) to correspond to the first and second pixel electrodes 311 and 321, whereas the HIL, the HTP, the ETL, and/or the EIL may be integrally and commonly provided relative to the first and second pixel electrodes 311 and 321. FIG. 4 illustrates, for example, a for forming the HTL 330 integrally provided throughout the layered structure, where the HTL 330 extends to the first and second pixel electrodes 311 and 321 (see FIG. 3). Here, while arranging the material for forming the HTL 330 on the layered structure, portions of such material of the HTL 330 may also be included in the first groove 101, the second groove 102, the first test concave portion 104 and the second test concave portion 105 of the substrate 100.

For convenience, the portions of the material included in the first groove 101 is referred to as a first remaining layer 331, the portions of the material included in the second groove 102 is referred to as a second remaining layer 332, and the portions of the material included in the first and second test concave portions 104 and 105 is referred to as a test remaining layer 333. Also, for convenience, the portions of the material forming the HTL 330 will now be referred to as a main layer 330.

An edge of the first remaining layer 331 is positioned in the first groove 101, an edge of the second remaining layer 332 is positioned in the second groove 102, and an edge of the test remaining layer 333 is positioned in the first or second test concave portion 104 or 105. Here, the first remaining layer 331, the second remaining layer 332, and the test remaining layer 333 may include the same material as the main layer 330. That is, the first remaining layer 331, the second remaining layer 332, the test remaining layer 333 and the main layer 330 may be formed from a same single material layer to be portions thereof.

As described above, the first insulating layer has a shape arranged relative to a respective center of each of the first groove 101, the second groove 102, the first test concave portion 104 and the second test concave portion 105 of the substrate 100. Accordingly, when the main layer 330 is provided integrally throughout the first and second pixel electrodes 311 and 321, the first and second remaining layers 331 and 332 and the test remaining layer 333 in the first groove 101, the second groove 102, the first test concave portion 104 and the second test concave portion 105 of the substrate 100 are spaced apart from the main layer 330. In other words, even when a portion of the main layer 330 is provided on an inner surface of each of the first insulating through ring 121, the second insulating through ring 122, the first insulating through hole 124, and the second insulating through hole 125 of the first insulating layer, the portion of the main layer 330 is not connected to the first and second remaining layers 331 and 332 and the test remaining layer 333 in the first groove 101, the second groove 102, the first test concave portion 104 and the second test concave portion 105 of the substrate 100.

On the intermediate layer (represented by the main layer 330, the first and second remaining layers 331 and 332 and the test remaining layer 333), a material layer for forming an opposite electrode (not shown) is integrally provided throughout the layered structure on the substrate 100, including the first and second pixel electrodes 311 and 321. Such an opposite electrode may include a layer including a material, such as ITO, IZO, or $In_2O_3$, and/or a conductive layer including aluminum. The opposite electrode may have the same and/or similar shape as the main layer 330 and the first and second remaining layers 331 and 332 and the test remaining layer 333 of FIG. 4, in the top plan view. The opposite electrode together with a pixel electrode may be applied with electrical signals using a TFT, to generate light and/or display an image. In an embodiment, the intermediate layer may be disposed between the opposite electrode and the pixel electrode within a light-emitting element of the display apparatus, and may generate and emit light when the electrical signals are applied to the opposite and pixel electrodes.

As shown in FIG. 5, the main through hole 109 is provided or defined in the substrate 100 and various layers which are disposed thereon. At this time, an insulating through hole 129 connected to the main through hole 109 of the substrate 100 is simultaneously provided in the first insulating layer. A through hole corresponding to the insulating through hole 129 is simultaneously provided in the second insulating layer. The main through hole 109, the insulating through hole 129 in the first insulating layer, and the through hole in the second insulating layer may be provided via a laser ablation technology ("LAT") performed by irradiating a laser beam. The center of the main through hole 109 along the x-y plane and the center of the insulating through hole 129 along the x-y plane may match each other.

For reference, FIG. 5 illustrates only the main layer 330 having a single layer structure, and the first and second remaining layers 331 and 332 and the test remaining layer 333 having a single layer structure. However, embodiments are not limited thereto, and a layer integrally provided throughout the layered structure on the substrate 100, including the first and second pixel electrodes 311 and 321, which is an intermediate layer including other layers in addition to a HTL, and an opposite electrode integrally provided throughout the layered structure on the substrate 100, including the first and second pixel electrodes 311 and 321 may also have the same and/or similar shape as the HTL and/or such intermediate layer. Accordingly, the main layer 330, the first and second remaining layers 331 and 332, and the test remaining layer 333 may have a multilayer structure in embodiments. In this case, a multi-layer structure of the main layer 330 may be the same as a multi-layer structure of the first and second remaining layers 331 and 332 and the test remaining layer 333. That is, the first remaining layer 331, the second remaining layer 332, the test remaining layer 333 and the main layer 330 may be formed from a same multi-layer material layer. The same is applied to embodiments and modifications thereof described hereinbelow.

In the display apparatus according to one or more embodiment manufactured as such, the main layer 330 is exposed to outside the layered structure at the main through hole 109, the insulating through hole 129 in the first insulating layer, and the through hole in the second insulating layer. Thus, impurities, such as moisture or oxygen may penetrate into the main layer 330 exposed at the main through hole 109, the insulating through hole 129 and the through hole during manufacture of the display apparatus or during use thereof.

When the first and second groove 101 and 102 do not exist in the substrate 100 and the first and second insulating through rings 121 and 122 do not exist in the first insulating layer, the main layer 330 may be continuous from the main through hole 109, the insulating through hole 129 and the through hole, to the first pixel electrode 311 and/or the second pixel electrode 321. As such, impurities, such as moisture or oxygen, may move along the continuous main layer 330 and penetrate into the first pixel electrode 311 and/or the second pixel electrode 321, thereby causing a defect of a first pixel PX1 (see FIG. 3) or a second pixel PX2 (see FIG. 3).

However, in one or more embodiment of the display apparatus according to the invention, since the first and second grooves 101 and 102 are provided in the substrate 100 and the first and second insulating through rings 121 and 122 are provided in the first insulating layer, a portion of the main layer 330 exposed at the main through hole 109 the insulating through hole 129 and the through hole is not connected to a portion of the main layer 330 at the first or second pixel PX1 or PX2. Accordingly, occurrence of a defect in the first or second pixel PX1 or PX2 caused by the impurities, such as moisture or oxygen, may be reduced or effectively prevented.

A defect is further effectively prevented from occurring in the first or second pixel PX1 or PX2 since the first insulating layer has a shape arranged relative to a respective center of each of the first and second grooves 101 and 102 of the substrate 100 at various positions thereof. Accordingly, determination of a location of a shape of openings in the first insulating layer relative to a respective center of each of the first and second grooves 101 and 102 of the substrate 100 during manufacture of a display apparatus is desired.

In the display apparatus according to one or more embodiment, the first and second test concave portions 104 and 105 are provided recessed from an upper surface of the substrate 100 at the same time the first and second grooves 101 and 102 are provided recessed from the upper surface of the substrate 100, and the first and second insulating through holes 124 and 125 are provided penetrating through the first insulating layer at the same time the first and second insulating through rings 121 and 122 are provided penetrating through the first insulating layer.

As elements 101, 102, 104 and 105 are simultaneously formed in a same material layer (e.g., the substrate 100) and elements 121, 122, 124 and 125 are simultaneously formed in a same material layer (e.g., the first insulating layer) a patterning rate, removal rate, etc. is the same within the elements 101, 102, 104 and 105 and within the elements 121, 122, 124 and 125. Therefore, examining or inspecting a dimension or a shape of one element among the elements 101, 102, 104 and 105 provides information about other elements among the elements 101, 102, 104 and 105. The same can be said for the elements 121, 122, 124 and 125. The dimension or shape being the same among the elements 101, 102, 104 and 105 or among the elements 121, 122, 124 and 125 may be taken or referenced along the x-y plane in any of a number of directions within such plane. For the elements 121, 122, 124 and 125 formed by the first insulating layer as, the dimension or shape described above may be defined by a portion of the first insulating layer at or overlapping the elements 121, 122, 124 and 125, or may be a distance between portions of the first insulating layer at or overlapping the elements 121, 122, 124 and 125 (e.g., a width of the opening defined between portions of the first insulating layer at 121, 122, 124 and 125).

Accordingly, a degree of the first insulating layer protruding from an edge of each of the first and second grooves 101 and 102 of the substrate 100 toward the center of each of the first and second grooves 101 and 102 of the substrate 100 may be the same as or similar to a degree of the first insulating layer protruding from an edge of each of the first and second test concave portions 104 and 105 of the substrate 100 toward the center of each of the first and second test concave portions 104 and 105 of the substrate 100. The protruding portion of such first insulating layer towards the center of the respective groove or concave portion may be considered as disposed overlapping with or corresponding to the groove or concave portion. Accordingly, by determining a dimension or shape of the protruding portion of the first insulating layer overlapping with or corresponding to each of the first and second test concave portions 104 and 105 of the substrate 100, a dimension or shape of the first insulating layer overlapping with or corresponding to each of the first and second grooves 101 and 102 of the substrate 100 can be determined.

In order for the dimension or shape of the protruding portion of the first insulating layer overlapping with or corresponding to the first test concave portion 104 of the substrate 100 to be the same as or very similar to the dimension or shape of the protruding portion of the first insulating layer overlapping with or corresponding to the first groove 101 of the substrate 100, a diameter of the first insulating through hole 124 along the x-y plane may be set to be the same as the width of the first insulating through ring 121 along the x-y plane. When the first insulating layer is etched such that the diameter of the first insulating through hole 124 along the x-y plane is the same as the width of the first insulating through ring 121 along the x-y plane, the diameter of the first test concave portion 104 of the substrate 100 along the x-y plane also becomes the same as the width of the first groove 101 of the substrate 100 along the x-y plane. Under the same reasoning, the width of the second insulating through ring 122 along the x-y plane may also be the same as the diameter of the first insulating through hole 124 along the x-y plane.

For reference, as shown in FIG. 2, when a test concave portion is provided in plurality around the main through hole 109 in addition to the first and second test concave portions 104 and 105, a dimension or shape of the protruding portion of the first insulating layer overlapping with or corresponding to each of the plurality of test concave portions may be determined to accurately determine a dimension or shape of the protruding portion of the first insulating layer overlapping with or corresponding to of each of the first and second grooves 101 and 102 of the substrate 100 at various positions along the substrate 100.

Figure 6:
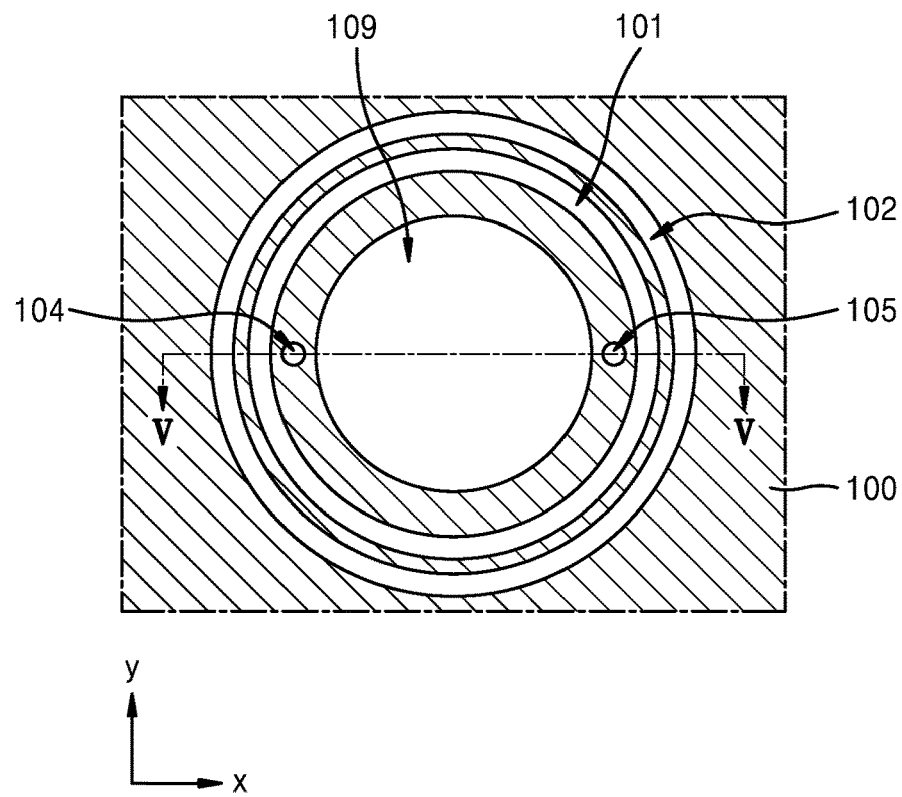
FIG. 6 is an enlarged top plan view of a portion of another embodiment of a substrate of a display apparatus, according to the invention.

However, embodiments are not limited thereto. FIG. 6 is an enlarged top plan view of a portion of another embodiment of the substrate 100 of a display apparatus according to the invention. In FIG. 6, only two test concave portions are disposed relative to the main through hole 109. More particularly, the first and second test concave portions 104 and 105 are defined in the substrate 100 to be symmetrical based on a center of the main through hole 109. In other words, only two test concave portions may exist outside the main through hole 109. In this case, referring to FIGS. 3 through 5, only two of the first and second insulating through holes 124 and 125 exist in the first insulating layer.

A cross-sectional view taken along line V-V in FIG. 6 crossing the first and second test concave portions 104 and 105 of FIG. 6 may be the same as that of the cross-sectional view along line III-III of FIG. 2, which is represented in FIGS. 3 through 5. As previously noted, FIGS. 3 through 5 illustrate components and layers other than the substrate 100. In an alternative embodiment, only the first test concave portion among 104 and 105 may exist outside the main through hole 109. In other words, only one test concave portion may be positioned outside the main through hole 109 instead of a plurality of test concave portions. In this case, referring to FIGS. 3 through 5, only one insulating through hole exists in the first insulating layer.

Figure 7:
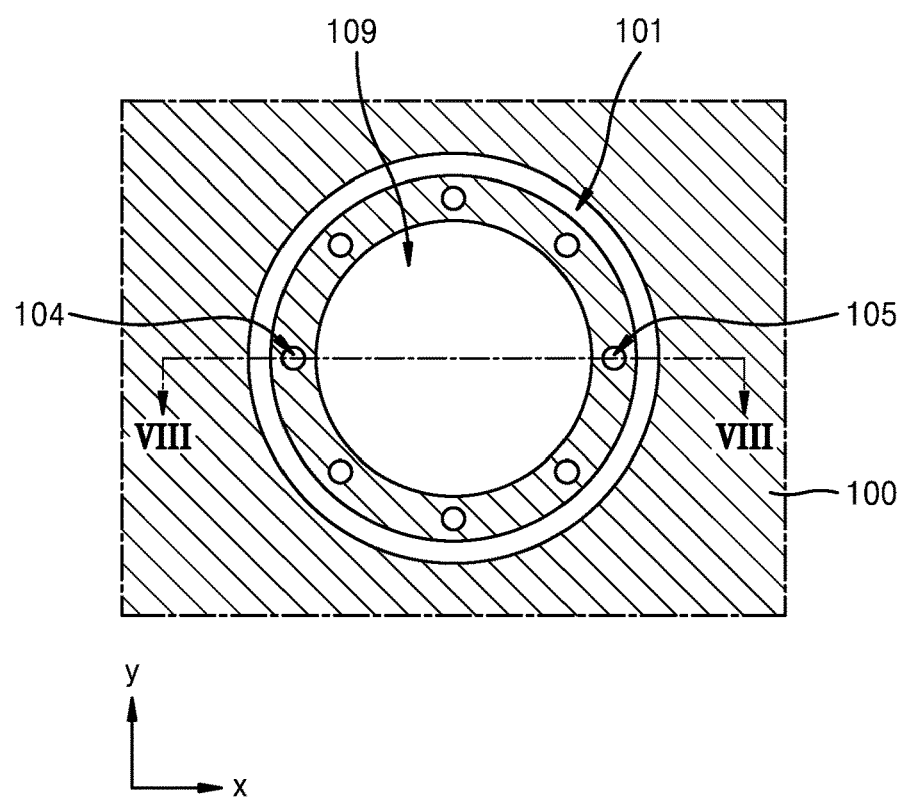
FIG. 7 is an enlarged top plan view of a portion still another embodiment of a substrate of a display apparatus, according to the invention.
Figure 8:
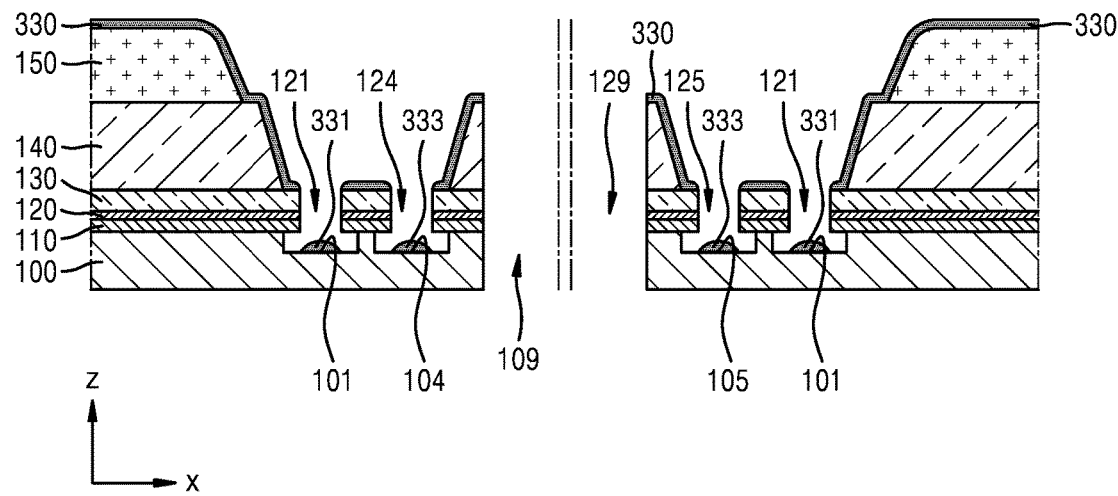
FIG. 8 is a cross-sectional view of the portion of the display apparatus of FIG. 7 taken along line VIII-VIII of FIG. 7.

Hereinabove, a display apparatus includes the second groove 102 in addition to the first groove 101, but is not limited thereto. For example, FIG. 7 is an enlarged top plan view of a portion of still another embodiment of a display apparatus, according to the invention and FIG. 8 is a cross-sectional view of the portion of the display apparatus of FIG. 7 taken along line VIII-VIII of FIG. 7. As shown in FIGS. 7 and 8, the substrate 100 may include only the first groove 101 and the first insulating layer may include only the first insulating through ring 121. In this case as well, the substrate 100 includes the first and second test concave portions 104 and 105, and the first insulating layer includes the corresponding first and second insulating through holes 124 and 125. In embodiments, the number of test concave portions and the number of corresponding insulating through holes may vary, and for example, may each be one.

Figure 9:
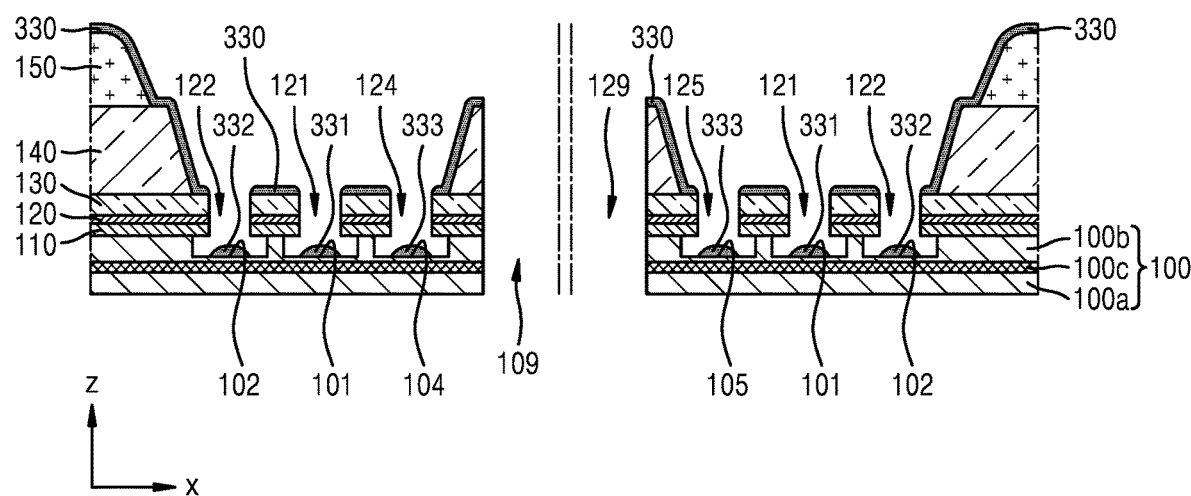
FIG. 9 is a cross-sectional view of a portion of yet another embodiment of a display apparatus, according to the invention.

FIG. 9 is a cross-sectional view of a portion of yet another embodiment of a display apparatus, according to the invention. A difference between the display apparatus in FIG. 9 and the display apparatus according to the previous embodiment described above with reference to FIG. 4 is that the substrate 100 in FIG. 9 has a multilayer structure. As shown in FIG. 9, the substrate 100 collectively includes a first polymer layer 100a, a second polymer layer 100b which is positioned on the first insulating layer including the buffer layer 110, the gate insulating layer 120 and the interlayer insulating layer 130 and closer the first insulating layer than the first polymer layer 100a, and a barrier layer 100c which is arranged between the first polymer layer 100a and the second polymer layer 100b.

The first and second polymer layers 100a and 100b may each include polymer resin, such as PES, polyacrylate, PEI, PEN, PET, PPS, PAR, PI, PC or CAP. The barrier layer 100c may include an inorganic material, such as silicon oxide, silicon nitride, and/or silicon oxynitride. The barrier layer 100c reduces or effectively prevents external impurities passed through the first polymer layer 100a from moving to the second polymer layer 100b, thereby reducing or effectively preventing a defect occurring when impurities penetrate into the first and second TFTs 210 and 220 (see FIG. 3) on the substrate 100.

The main through hole 109 provided on the substrate 100 penetrates the first polymer layer 100a, the barrier layer 100c and the second polymer layer 100b. However, from the upper surface of the substrate 100, the depth of the first groove 101 in a direction of the barrier layer 100c and the depth of the first test concave portion 104 in the direction of the barrier layer 100c may be smaller than a total thickness of the second polymer layer 100b. Also, from the upper surface of the substrate 100, the depth of the second groove 102 in the direction of the barrier layer 100c and the depth of the second test concave portion 105 in the direction of the barrier layer 100c may also be smaller than the total thickness of the second polymer layer 100b. Accordingly, damage to the barrier layer 100c while forming the first groove 101 and the first test concave portion 104 may be reduced or effectively prevented. As a result, movement of external impurities to the second polymer layer 100b through the first polymer layer 100a and the barrier layer 100c may be reduced or effectively prevented.

Hereinabove, a display apparatus has been mainly described, but an embodiment is not limited thereto. In embodiments, an electronic apparatus including the display apparatus as a component is also within the range of the present disclosure. In this case, an image pickup device such as the camera CAM (see FIG. 1) or the speaker SPK (see FIG. 1) may be inserted into the main through hole 109 and holes corresponding thereto of the display apparatus. Other various input and/or output electronic devices or components may be inserted into the main through hole 109 and the holes corresponding thereto of the display apparatus. Such input and/or output devices may be exposed outside of the display apparatus (or an electronic apparatus including the display apparatus), at the main through hole 109.

According to one or more embodiments, a display apparatus capable of reducing or effectively preventing the occurrence of a defect during manufacture or use of such display apparatus, and for which the presence of a manufacturing process device can be quickly determined, and an electronic apparatus including the display apparatus may be realized.

It should be understood that embodiments described herein should be considered in a descriptive sense only and not for purposes of limitation. Descriptions of features within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate comprising defined therein:
   a main through hole extended through a thickness of the substrate,
   a first groove extended around the main through hole to be disposed outside the main through hole, and
   a first test concave portion disposed outside the main through hole; and
an insulating layer on the substrate, the insulating layer comprising defined therein:
   a main insulating through hole aligned with and connected to the main through hole of the substrate along the thickness thereof,
   a first insulating through ring extended around the main insulating through hole to be disposed outside the main insulating through hole, the first insulating through ring connected to the first groove of the substrate along the thickness thereof, and
   a first insulating through hole disposed outside the main insulating through hole, the first insulating through hole connected to the first test concave portion of the substrate along the thickness thereof,
wherein along a same width direction:
   a width of the first insulating through ring of the insulating layer is less than a width of the first groove of the substrate, and
   a width of the first insulating through hole is less than a width of the first test concave portion.

2. The display apparatus of claim 1, wherein a center of the main through hole and a center of the insulating through hole match, a center axis of the first groove and a center axis of the first insulating through ring match, and a center of the first test concave portion and a center of the first insulating through hole match.

3. The display apparatus of claim 1, wherein along the same width direction, the first test concave portion is between the main through hole and the first groove.

4. The display apparatus of claim 1, wherein the width of the first insulating through ring and the width of the first insulating through hole are the same.

5. The display apparatus of claim 1, further comprising a first remaining layer disposed in the first groove of the substrate.

6. The display apparatus of claim 5, further comprising a main layer disposing the insulating layer between the substrate and the main layer and being disconnected from the first remaining layer.

7. The display apparatus of claim 1, wherein
the substrate further comprises defined therein a second groove extended around the main through hole to be disposed outside the main through hole and spaced apart from the first groove, and
the insulating layer further comprises defined therein a second insulating through ring extended around the main insulating through hole to be disposed outside the main insulating through hole of the insulating layer and spaced apart from the first insulating through ring of the insulating layer, the second insulating through ring connected to the second groove of the substrate along the thickness thereof,
wherein a width of the second insulating through ring of the insulating layer is less than a width of the second groove of the substrate.

8. The display apparatus of claim 7, further comprising:
a first remaining layer disposed in the first groove of the substrate; and
a second remaining layer disposed in the second groove and being disconnected from the first remaining layer.

9. The display apparatus of claim 8, further comprising a main layer disposing the insulating layer between the substrate and the main layer and being disconnected from each of the first and second remaining layers.

10. The display apparatus of claim 1, wherein
the substrate further comprises defined therein a second test concave portion disposed outside the main through hole and spaced apart from the first test concave portion, and
the insulating layer further comprises defined therein a second insulating through hole disposed outside the main insulating through hole and spaced apart from the first insulating through hole, the second insulating through hole connected to the second test concave portion of the substrate along the thickness thereof,
wherein a width of the second insulating through hole of the insulating layer is less than a width of the second test concave portion of the substrate.

11. The display apparatus of claim 10, wherein along the same width direction, a position of the first test concave portion and a position of the second test concave portion are symmetrical based on a center of the main through hole.

12. The display apparatus of claim 11, wherein along the same width direction, the first test concave portion and the second test concave portion are each between the main through hole and the first groove.

13. The display apparatus of claim 1, wherein the substrate further comprises a display area at which an image is displayed, the main through hole of the substrate disposed inside the display area.

14. The display apparatus of claim 13, further comprising:
a light-emitting element which is disposed on a portion of the insulating layer corresponding the display area, the light-emitting element comprising a pixel electrode, an opposite electrode, and an intermediate layer between the pixel electrode and the opposite electrode and together with the pixel and opposite electrodes generate light, the intermediate layer being a portion of an intermediate material layer, and
a first remaining layer as a portion of the same intermediate material layer as the intermediate layer of the light-emitting element,
wherein the first remaining layer is disposed in the first groove to be disconnected from the intermediate layer of the light-emitting element.

15. The display apparatus of claim 1, wherein
the substrate further comprises a first polymer layer, a second polymer layer which is closer to the insulating layer than the first polymer layer and defines an upper surface of the substrate, and a barrier layer between the first polymer layer and the second polymer layer,
the main through hole of the substrate penetrates each of the first polymer layer, the barrier layer and the second polymer layer,
from the upper surface of the substrate and along the thickness of the substrate, a depth of the first groove and a depth of the first test concave portion are each less than a thickness of the second polymer layer.

16. The display apparatus of claim 1, wherein the insulating layer comprises an inorganic material.

17. The display apparatus of claim 1, wherein
the first groove and the first test concave portion of the substrate are open to outside the substrate at a first side thereof, the main through hole of the substrate is open to outside the substrate at a second side thereof which is opposite to the first side, and an inner area of the main through hole of the substrate is exposed to outside the display apparatus.

18. The display apparatus of claim 1, further comprising:

a light-emitting element comprising a light-emission layer which is a portion of a light-emission material layer disposed on the substrate, a main layer as a portion of the same light-emission material layer as the light-emission layer of the light-emitting element, the main layer disposed on a portion of the insulating layer which is located at the main through hole of the substrate, a remaining layer as a portion of the same light-emission material layer as the light-emission layer of the light-emitting element and as the main layer, the remaining layer disposed in the first groove of the substrate, and the light-emission layer of the light-emitting element, the main layer and the remaining layer are disconnected from each other.

19. An electronic apparatus comprising:

the display apparatus of claim 1; and an image pickup device or speaker inserted into the main through hole of the substrate.

20. The electronic apparatus of claim 19, wherein the image pickup device or speaker inserted into the main through hole of the substrate is exposed to outside the electronic apparatus at the main through hole of the substrate.

* * * * *